United States Patent
Ozaki et al.

(10) Patent No.: US 8,207,059 B2
(45) Date of Patent: Jun. 26, 2012

(54) SILICON COMPOUND, ULTRAVIOLET ABSORBENT, METHOD FOR MANUFACTURING MULTILAYER WIRING DEVICE AND MULTILAYER WIRING DEVICE

(75) Inventors: Shirou Ozaki, Kawasaki (JP); Yoshihiro Nakata, Kawasaki (JP); Ei Yano, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 552 days.

(21) Appl. No.: 12/185,367

(22) Filed: Aug. 4, 2008

(65) Prior Publication Data

US 2009/0038833 A1    Feb. 12, 2009

(30) Foreign Application Priority Data

Aug. 10, 2007   (JP) ................. 2007-209505

(51) Int. Cl.
*H01L 21/4763* (2006.01)
*H01L 21/31* (2006.01)

(52) U.S. Cl. ........ 438/623; 438/624; 438/761; 438/781; 257/E21.575; 257/E21.273

(58) Field of Classification Search .......... 438/781, 438/782, 623, 624, 622, 761; 257/E21.575, 257/E21.273
See application file for complete search history.

(56) References Cited

U.S. PATENT DOCUMENTS

| | | | |
|---|---|---|---|
| 4,761,458 A | 8/1988 | Burns et al. | |
| 4,824,529 A * | 4/1989 | Thompson et al. | 205/778 |
| 5,087,685 A | 2/1992 | Sartori et al. | |
| 5,132,375 A | 7/1992 | Satori et al. | |
| 5,500,533 A * | 3/1996 | Ogawa et al. | 250/372 |
| 6,395,649 B1 | 5/2002 | Wu | |
| 7,262,142 B2 | 8/2007 | Nakata et al. | |
| 7,297,360 B2 | 11/2007 | Yoshioka et al. | |
| 2003/0089903 A1 | 5/2003 | Nakata et al. | |
| 2004/0110896 A1 | 6/2004 | Yoshioka et al. | |
| 2006/0128166 A1 | 6/2006 | Nakata et al. | |
| 2006/0128167 A1 * | 6/2006 | Nakata et al. | 438/795 |
| 2007/0093587 A1 | 4/2007 | Shen et al. | |
| 2007/0190461 A1 * | 8/2007 | Ozaki et al. | 430/311 |
| 2007/0232058 A1 * | 10/2007 | Ozaki et al. | 438/622 |

FOREIGN PATENT DOCUMENTS

| | | |
|---|---|---|
| DE | 38 41 348 A1 | 6/1990 |
| DE | 39 17 838 A1 | 12/1990 |
| DE | 42 14 045 A1 | 11/1993 |
| EP | 1 308 476 A1 | 5/2003 |
| JP | 11-105186 A | 4/1999 |
| JP | 2002-170883 A | 6/2002 |
| JP | 2004-186610 A | 7/2004 |

(Continued)

OTHER PUBLICATIONS

English Machine Translation of KR-10-0743440, Published date Jul. 30, 2007, 23 pages.*

(Continued)

*Primary Examiner* — Michael Trinh (74) *Attorney, Agent, or Firm* — Westerman, Hattori, Daniels & Adrian, LLP (57) ABSTRACT

A layer of a porous insulating film precursor is formed on or over a substrate, a layer of a specific silicon compound is then formed, this silicon compound layer is pre-cured as necessary, and the porous insulating film precursor is exposed to UV through the silicon compound layer or pre-cured layer.

18 Claims, 9 Drawing Sheets

FOREIGN PATENT DOCUMENTS

| | | |
|---|---|---|
| JP | 2006-190962 A | 7/2006 |
| KR | 10-0743440 B1 | 4/2007 |
| WO | 2007/051089 A2 | 5/2007 |

OTHER PUBLICATIONS

Habel, Wolfgang et al.; "Synthese und Charakterisierung von Poly(dialkenylsilylen-co-methylenen) als Grundmaterialien von SiC-Fasern"; Journal of Organometallic Chemistry, vol. 486, No. 1, Jan. 25, 1995, pp. 267-273, XP004024378.

Habel, Wolfgang et al.; "Synthese und Charakterisierung von Poly(dialkenylsilylen-co-methylenen)"; Journal of Organometallic Chemistry, vol. 494, No. 1, May 31, 1995, pp. 157-163, XP004023967.

European Search Report dated Jan. 23, 2009, issued in corresponding european Paten Application No. 08161631.0.

Korean Office Action dated Jul. 28, 2010, issued in corresponding Korean Patent Application No. 10-2008-0076965.

Korean Office Action dated Dec. 21, 2010, issued in corresponding Korean Patent Application No. 10-2008-0076965.

Chinese Office Action dated May 18, 2011, issued in corresponding Chinese Patent Application No. 200810129731.0.

European Office Action dated Apr. 20, 2011, issued in corresponding European Patent Application No. 08161631.0.

Chinese Office Action dated Nov. 23, 2011, issued in corresponding Chinese Patent Application No. 200810129731.0 w/English translation of the Examiner's comments is attached.

* cited by examiner

SILICON COMPOUND, ULTRAVIOLET ABSORBENT, METHOD FOR MANUFACTURING MULTILAYER WIRING DEVICE AND MULTILAYER WIRING DEVICE

CROSS-REFERENCE TO RELATED APPLICATIONS

This application is based upon and claims the benefit of priority from the prior Japanese Patent Application No. 2007-209505, filed on Aug. 10, 2007, the entire contents of which are incorporated herein by reference.

BACKGROUND OF THE INVENTION

1. Field of the Invention

The present invention relates to a multilayer wiring device and to the insulating film structure thereof.

2. Description of the Related Art

It has long been known that increased parasitic capacitance of an insulating film leads to decreased signal transmission speed, but when the wire spacing of semiconductor devices was over 1 μm, the effect of wiring delay on the device as a whole was small.

However, the effect on device speed is greater when the wire spacing is 1 μm or less, and in the future when circuits are formed with a wire spacing of 0.1 μm or less, the parasitic capacitance between wires will have a much greater effect on device speed.

Specifically, as integrated semiconductor devices become more integrated and element density increases, and particularly as demand increases for more multilayered semiconductor elements, the wire spacing is becoming narrower as the devices become more integrated, and wiring delay due to increased capacitance between wires is becoming more of a problem. Wiring delay (T) is affected by wiring resistance (R) and capacitance between wires (C), as shown by Formula (3) below.

$$T \propto CR \quad (3)$$

The relationship between $\epsilon$ (permittivity) and C in Formula (1) is shown by Formula (4).

$$C = \epsilon 0 \epsilon r S/d \quad (4)$$

(wherein S is the electrode area, $\epsilon 0$ is the permittivity in vacuum, $\epsilon r$ is the permittivity of an insulating film and d is the wire spacing).

Consequently, an effective means of reducing the wiring delay is to reduce the permittivity of the insulating film.

At present, the principal kinds of insulating films used in the multilayer wiring structures of semiconductor devices and other multilayer wiring devices are low-permittivity coated insulating films and diffusion barrier insulating films and etching stopper layers formed by plasma CVD.

Inorganic films such as silicon dioxide ($SiO_2$), silicon nitride (SiN) and phosphosilicate glass (PSG) or organic polymers such as polyimide and the like have conventionally been used as these insulating materials. However, the CVD-$SiO_2$ films most commonly used in semiconductor devices have a relative permittivity as high as about 4. SiOF films, which are being explored as candidates for low-permittivity CVD films, have a relative permittivity of about 3.3 to 3.5, but are highly hygroscopic, and therefore permittivity tends to increase with time. Another recently-developed kind of low-permittivity film is produced by adding an organic resin or the like which is evaporated or decomposed by heat to a low-permittivity film-forming material, and then applying heat during film formation to produce a porous film, but because these are porous they are normally mechanically weak. Moreover, at present the pore size is large (10 nm or more), and if porosity is increased in order to reduce permittivity, permittivity is likely to rise and film strength to decline due to moisture absorption.

To solve this problem, methods are being studied for hardening and strengthening the insulating film by ultraviolet, plasma or electron beams after film formation, but in all these methods the insulating film is liable to increased permittivity and loss of thickness due to cleavage of Si—C bonds, which is observed as elimination of organic groups (principally $CH_3$ groups), so an adequate solution has yet to be found. When the porosity of a porous insulating film is increased in an effort to reduce permittivity, the film becomes more hygroscopic, and the increase in permittivity of the insulating film due to Si—C bond cleavage tends to be more noticeable.

In an effort to control these damages and improve film strength without sacrificing permittivity (Japanese Patent Application No. 2004-356618, claims and Japanese Patent Application No. 2005-235850, claims), a method has been studied of forming a high-density insulating film on a porous insulating film and then exposing it to UV, plasma or electron beams from above, with some success, but more strength is still necessary for device applications.

SUMMARY OF THE INVENTION

One aspect of embodiments provides a silicon compound having a structure in which at least part of $R^1$ through $R^3$ in the silicon compound consisting of a polycarbosilane represented by Formula 1 below, a polysilazane represented by Formula 2 below or a mixture thereof is substituted with another group, and having higher UV absorbency at 210 nm or less than a silicon compound without the substitution:

[C3]

(1)

[C4]

(2)

(wherein in Formula 1, $R^1$ and $R^2$ may be the same or different and each represents a hydrogen atom or optionally substituted alkyl group, alkenyl group, cycloalkyl group or aryl group, and n is a number from 10 to 1000; and in Formula 2, $R^1$, $R^2$ and $R^3$ may be the same or different and each represents a hydrogen atom or optionally substituted alkyl group, alkenyl group, cycloalkyl group or aryl group, but at least one of substituents $R^1$, $R^2$ and $R^3$ is a hydrogen atom, and n is the number of repeating units necessary to give the silazane polymer a number-average molecular weight of 100 to 50,000; and the symbols in Formula 1 and Formula 2 are independent of each other).

DESCRIPTION OF THE PREFERRED EMBODIMENTS

Embodiments are explained below using drawings, tables, examples and the like. These drawings, tables, examples and the like and explanations are meant as examples of the present invention, and do not limit its scope. Other embodiments can of course also be included in the scope of the present invention so long as they are consistent with its intent.

The insulating films of semiconductor devices and other multilayer wiring devices are normally cured with ultraviolet after film formation to make them stronger. However, there is a risk of increased permittivity due to cleavage of Si—C bonds by the ultraviolet. If an ultraviolet filter is used to restrict the UV to a specific wavelength band in an effort to control this problem, there is less UV exposure and mechanical strength is not improved. This is a particular problem in the case of porous insulating films, which are seen as a potential means of achieving low permittivity but which are porous and therefore mechanically weak.

Cleavage of Si—C bonds is specifically observed as cleavage of organic groups (particularly $CH_3$ groups) bound to Si.

To resolve this problem, the UV curing technique shown in the embodiments uses a specific silicon compound that absorbs UV at 210 nm or less as a filter on a porous insulating film precursor to thereby provide a silicon compound layer (which can also be pre-cured as necessary to produce a pre-cured layer) between the UV source and the porous insulating film precursor, so that only UV at longer wavelengths above 210 nm selectively reaches the porous insulating film precursor, thereby preventing cleavage of Si—C bonds and promoting dehydrative condensation of silanols, which are a cause of increased permittivity due to moisture absorption.

Penetration of moisture to the porous insulating film can also be controlled if this silicon compound layer is cured. Film strength can thus be improved while maintaining low permittivity, allowing the formation of a highly reliable high-speed circuit substrate. Because the specific silicon compound layer or a layer obtained by pre-curing this layer according to the embodiments efficiently absorbs UV at 210 nm or less without unnecessarily absorbing UV at longer wavelengths above 210 nm, exposure is not diminished or is diminished to a lesser extent than it is with conventional UV filters.

This specific silicon compound is specifically a silicon compound having a structure in which at least part of $R^1$ through $R^3$ in the silicon compound consisting of a polycarbosilane represented by Formula 1 below, a polysilazane represented by Formula 2 below or a mixture thereof is substituted with another group, and having higher UV absorbency at 210 nm or less than a silicon compound without the substitution. The specific silicon compound is called a "substituted silicon compound" hereinafter.

In Formula 1, $R^1$ and $R^2$ may be the same or different and each represents a hydrogen atom or optionally substituted alkyl group, alkenyl group, cycloalkyl group or aryl group, and n is a number from 10 to 1000; and in Formula 2, $R^1$, $R^2$ and $R^3$ may be the same or different and each represents a hydrogen atom or optionally substituted alkyl group, alkenyl group, cycloalkyl group or aryl group, but at least one of substituents $R^1$, $R^2$ and $R^3$ is a hydrogen atom, and n is the number of repeating units necessary to give the silazane polymer a number-average molecular weight of 100 to 50,000; and the symbols in Formula 1 and Formula 2 are independent of each other.

The condition of being a silicon compound having higher UV absorbency at 210 nm or less than the unsubstituted silicon compound or in other words "the silicon compound represented by Formula 1 or Formula 2 without other substituents" can be determined by comparing absorbencies of all wavelength components of 210 nm or less during exposure to UV. In some cases, it can also be determined by comparing only absorbencies at a particular peak wavelength. In the embodiments it is usually sufficient that the condition be met as measured by either method, but it is particularly desirable that it be met as measured by the first method, and even more desirable that it be met as measured by both methods.

As a more specific evaluation method, it is desirable that the ratio of UV absorbency 1 of the silicon compound at the UV peak between 180 and 210 nm to UV absorbency 2 of the silicon compound at the UV peak between 210 and 350 nm (UV absorbency 1)/(UV absorbency 2) be greater than or equal to 2.5. The effect of the substituted silicon compound can thus be objectively evaluated, and a suitable substituted silicon compound can be easily selected from among a variety of compounds. The type of UV used for the evaluation standard can be determined at will, but since there may be some numerical difference depending on the UV used, it is better to use the identical UV source for comparative evaluation of various compounds. The types of UV sources discussed below as being suitable for use in the embodiments can be used for this UV source.

Because the aforementioned unsubstituted silicon compound absorbs almost no UV at 210 nm or less, the increase in UV absorbency at 210 nm or less can in many cases be expressed as acquiring a function to absorb UV at 210 nm or less. That is, the "silicon compound having higher UV absorbency at 210 nm or less than the unsubstituted silicon compound" can in many cases be referred to as the silicon compound capable of absorbing UV at 210 nm or less unlike the unsubstituted silicon compound.

It has been found that if a layer of this substituted silicon compound, or a pre-cured layer thereof, is provided between the UV source and the porous insulating film precursor layer, only UV of long wavelengths over 210 nm is selectively allowed to reach the porous insulating film precursor, so that cleavage of Si—C bonds in the precursor is controlled and dehydrative condensation of silanols can be promoted without any concern about Si—C bond cleavage. In this way, film strength can be increased while maintaining low permittivity, and a highly reliable high-speed circuit board can be formed. A layer obtained by curing this substituted silicon compound is resistant to moisture penetration and is useful in this regard for protecting the porous insulating film.

As used above, the term "pre-cure" means to remove the co-existing solvent or introduce crosslinked structures by heating for example as necessary in order to improve the stability of the substituted silicon compound layer as a film. This kind of operation is commonly called curing, but is called pre-curing here to distinguish it from the subsequent curing by ultraviolet exposure that is performed later. The substituted silicon compound may be exposed to UV without being pre-cured if this is convenient, but may also be exposed to UV after formation of a pre-cured layer if this is more convenient for handling purposes or the like. "As necessary" is used here in this sense.

As used above, "at least part of $R^1$ through $R^3$ is substituted with another group" means that at least part of $R^1$ and $R^2$ in Formula 1 is substituted with another group when using only the polycarbosilane represented by Formula 1, or that at least part of $R^1$ through $R^3$ in Formula 2 is substituted with another group when using only the polysilazane represented by Formula 2, or that at least part of $R^1$ and $R^2$ in Formula 1 and $R^1$ through $R^3$ in Formula 2 is substituted with another group when using a mixture of the polycarbosilane represented by Formula 1 and the polysilazane represented by Formula 2. The other group to be substituted need not be of one kind, and more than one kind of group can be used. "At least part" may mean that all of one group selected from $R^1$ through $R^3$ (that is, $R^1$ or $R^2$ or $R^3$) is substituted, but this is not necessarily the case. The degree of substitution can be selected appropriately depending on the desired UV absorbency at 210 nm or less.

The aforementioned limits (that is, limits on $R^1$ and $R^2$ and n in Formula 1 and $R^1$ through $R^3$ and n in Formula 2) in the unsubstituted silicon compound or in other words the silicon compound not substituted with another group in the embodiments are properties that have been determined according to availability and ease of handling. For example, if n is below the limit viscosity will be too low, while if n is above the limit viscosity will be too high and it may be difficult to form a film.

The "other group" may be any group that, when substituted, produces a substituted silicon compound having higher UV absorbency at 210 nm or less than the unsubstituted silicon compound, and may be discovered by trial and error.

It has been shown that the "other group" should preferably be selected from the group consisting of a benzyl group, carbonyl group, carboxy group, acryloyl group, diazo group, azide group, cinnamoyl group, acrylate group, cinnamylidene group, cyanocinnamylidene group, furylpentadiene group and p-phenylenediacrylate group.

The method of substitution with these groups is not particularly limited, and a known method may be used. The unsubstituted silicon compound may be prepared first, and the "other group" may then be substituted for its substituents, or the "other group" may be introduced in the raw material or during an intermediate reaction stage. An example of the former is a method using a Grignard reagent as described below.

When preparing a layer consisting of the substituted silicon compound, the compound may be formed into a film as is if the substituted silicon compound has sufficient fluidity. If the compound is not fluid or insufficiently fluid it is possible to use a solvent, which can then be removed appropriately by heating or the like. Any known method such as coating or the like can be used to form the film. This film is normally not porous.

The type of UV used is not particularly limited. From the standpoint of fully providing the effect which is to achieve absorption of the wavelength component of 210 nm or less, a UV source having a broad wavelength spectrum between 200 and 800 nm can be used. Such a UV source is sometimes called a broad-band light source. Examples of such light sources having wavelengths in the range of 200 to 800 nm include typically high-pressure mercury lamps, ozoneless high-pressure mercury lamps, metal halide lamps, xenon lamps and deuterium lamps. These light sources offer the advantage of greater intensity than Xe excimer lasers and the like. Another advantage is a smaller wavelength component of 210 nm and less.

The exposure conditions for UV exposure treatment are not particularly limited and can be selected appropriately according to the circumstances. The exposure environment is not particularly limited as long as UV exposure is performed in vacuum or under reduced or normal pressure, but exposure in vacuum is preferred from the standpoint of efficiency. An inactive gas such as nitrogen or argon may be supplied for purposes of pressure regulation or modification during ultraviolet exposure.

At 254 nm, the ultraviolet intensity on the exposed surface should preferably be 1 mW/cm$^2$ or more so that curing can be completed rapidly and so that dehydrative condensation of silanol groups, which are a cause of increased permittivity due to moisture absorption, can be promoted while inhibiting Si—C bond cleavage. The intensity in this case may differ somewhat depending on the instrument used to measure it. A spectroradiometer (USR-40D, Ushio Inc.) is used in the embodiments.

In terms of environmental temperature, heating at a temperature of 50 to 470° C. is useful during ultraviolet exposure. This promotes curing and helps to improve film strength and strengthen adhesiveness with the underlying insulating film. It is also an easy way to remove more of the residual solvent.

The temperature in this case need not be uniform, and it may be desirable to vary the temperature either in a straight line or curve or in stages. This temperature can be determined as the surface temperature of the substituted silicon compound layer or a pre-cured layer thereof.

The substituted silicon compound can be applied to a multilayer wiring device manufacturing method in which, on or over a substrate, a layer of a porous insulating film precursor is formed, a layer of the substituted silicon compound is formed, this silicon compound layer is pre-cured if necessary, and the porous insulating film precursor is exposed to UV through this substituted silicon compound layer or pre-cured layer. Here, the porous insulating film precursor means the precursor before it is cured by UV exposure. The porous insulating film precursor is normally already porous at this stage, but is not excluded if it is not porous at this stage.

Either the porous insulating film precursor layer or the substituted silicon compound layer can be formed first, and in some cases another layer may be provided between them. In most cases UV exposure is performed with the UV hitting the substituted silicon compound layer directly, but cases in which there is another layer between the UV source and the substituted silicon compound layer are not excluded.

More specifically, one method is to form a layer of a porous insulating film precursor on or over a substrate, then form a layer of the substituted silicon compound, pre-cure the silicon compound layer as necessary, and expose the porous insulating film precursor to UV through the substituted silicon compound layer or pre-cured layer thereof. In this case, since the porous insulating precursor and substituted silicon compound are in direct contact with each other, the porous insulating precursor must be somewhat solidified first so that the two do not mix. Solidification may be performed by any method, but heating is desirable from a practical standpoint. Such solidification can also be called pre-curing.

Here, an insulating film means a film or layer with insulating properties that is used in a multilayer wiring device, regardless of the name by which it is known. It is often used for insulation purposes, but may also be used for other primary or secondary purposes. These are often called insulating films, insulating layers, interlayer films, interlayer insulating films, interlayer insulating layers and the like.

A porous insulating film here means a film of this sort that is also porous. A porous insulating film is specified here because a porous insulating film is useful for providing low permittivity, and because porosity means low mechanical strength, which means that the effects of the embodiments here can be exploited to particular advantage.

A porous insulating film obtained after UV exposure of the porous insulating film precursor is not particularly limited as long as there are pores inside the film. Examples of such films include Carbon Doped $SiO_2$ films formed by vapor deposition, Porous Carbon Doped $SiO_2$ films with pores formed by addition of thermally-degradable compounds to such Carbon Doped $SiO_2$ films, and porous silica and organic porous films formed by spin coating. Of these, porous silica formed by spin coating is desirable from the standpoint of pore control and density control.

Examples of such porous silicas formed by spin coating include those wherein pores are formed by heating after addition of a thermally-degradable organic compound or the like to a polymer formed by hydrolysis and condensation polymerization of tetraalkoxysilane, trialkoxysilane, methyl trialkoxysilane, ethyl trialkoxysilane, propyl trialkoxysilane, phenyl trialkoxysilane, vinyl trialkoxysilane, allyl trialkoxysilane, glycidyl trialkoxysilane, dialkoxysilane, dimethyl dialkoxysilane, diethyl dialkoxysilane, dipropyl dialkoxysilane, diphenyl dialkoxysilane, divinyl dialkoxysilane, diallyl dialkoxysilane, diglycidyl dialkoxysilane, phenylmethyl dialkoxysilane, phenylethyl dialkoxysilane, phenylpropyl trialkoxysilane, phenylvinyl dialkoxysilane, phenylallyl dialkoxysilane, phenylglycidyl dialkoxysilane, methylvinyl dialkoxysilane, ethylvinyl dialkoxysilane, propylvinyl dialkoxysilane or the like.

A porous silica formed using a coatable silica cluster precursor (insulating material containing cluster silica) is also desirable because it has a small pore size and uniform pores. An example of a coatable silica cluster precursor is Catalysts & Chemicals Ind. Co., Ltd. Nanoclustering Silica (NCS), which can be coated on an object and exposed to either heat or ultraviolet while being heated to obtain a porous silica with a relative permittivity of about 2.25. A quaternary alkylamine is preferably used as a catalyst in forming the silica cluster precursor.

A solvent is sometimes used in preparing the porous insulating film. This solvent is normally removed by heating or the like at the stage of preparing the porous insulating film precursor.

A layer obtained by UV exposure of a layer of the substituted silicon compound or a pre-cured layer thereof, may be provided solely for the purpose of absorbing the UV. In this sense, the substituted silicon compound can be used as an ultraviolet absorber, a term that refers in general to objects that absorb ultraviolet.

This layer may also have other purposes, however, since it may have insulating properties or be capable of providing a hard surface. Specifically, it can often be used as the aforementioned insulating film, or as an etching stopper film or other stopper film. Because it can be used as a stopper film in this way, the substituted silicon compound layer or pre-cured layer thereof can sometimes be called a hard mask.

A multilayer wiring device prepared in this way has low permittivity and is highly reliable, and can help to increase the response speed of a semiconductor device or the like in particular.

EXAMPLES

Examples and comparative examples are explained in detail below, but the present invention is not limited thereby.

Examples 1 to 6

(1) Examples are explained with reference to FIGS. 1 through 8.

The terms optionally substituted silicon compound layer, pre-cured layer thereof and porous precursor layer are defined hereabove, but such terms are omitted for purposes of simplicity in the following explanation, in which the term "interlayer insulating film" includes those that are optionally substituted silicon compound layers or pre-cured layers thereof, while the term "multilayer insulating film" includes those that are porous precursor layers. Descriptions of the method of forming the pre-cured layer or porous precursor layer are omitted below.

The conditions for UV exposure hereunder are as follows. (UV Exposure Conditions)

Figure 9:
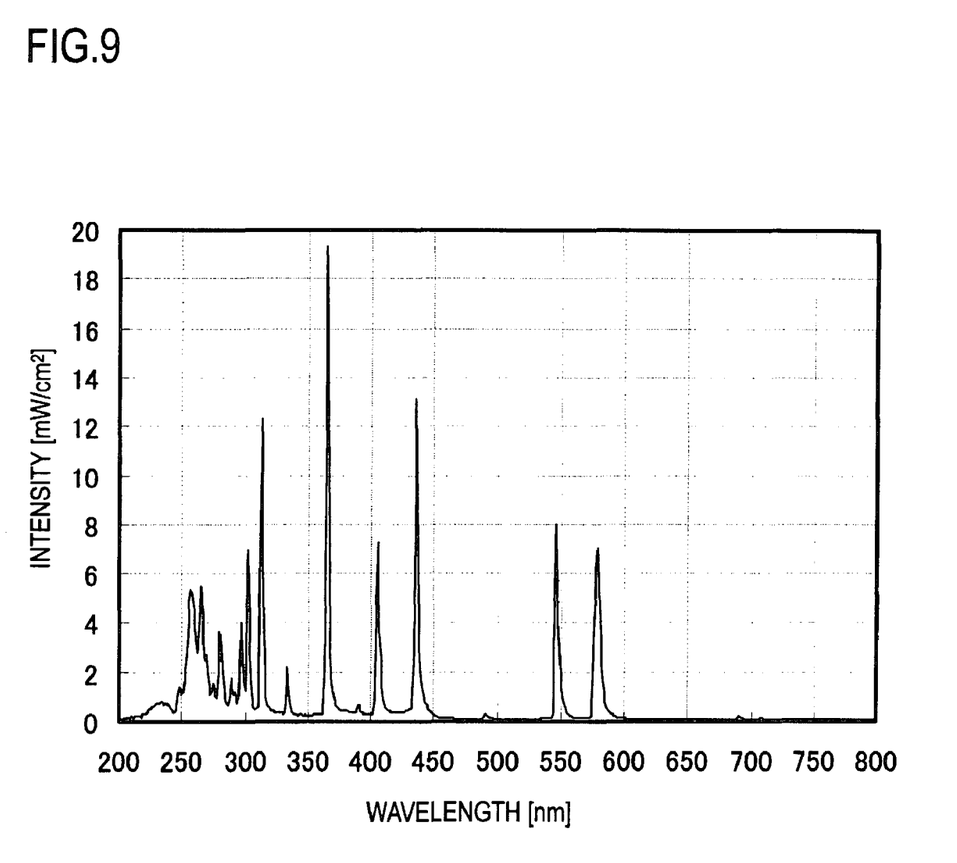
FIG. 9 shows the emission spectrum of a high-pressure mercury lamp (UVL-7000H4-N, Ushio Inc.).

UV curing was performed using a high-pressure mercury lamp (UVL-7000H4-N, Ushio Inc.) having the emission spectrum shown in FIG. 9. The intensity and spectrum distribution of the UV light were measured with a spectroradiometer (USR-40D, Ushio Inc.).

The UV intensity at 254 nm as measured with a spectroradiometer (USR-40D, Ushio Inc.) was 2.8 mW/cm$^2$. The surface temperatures of the silicon compound film here and a silicon compound of a corresponding comparative example during UV exposure were 350 to 400° C.

It was verified separately that all the silicon compounds used in the examples had higher UV absorbency at 210 nm or less than all the silicon compounds used in the comparative examples, and that (UV absorbency 1)/(UV absorbency 2)≧2.5 for all the silicon compounds used in the examples (see Example 7, Table 2).

In some cases there are multiple UV peaks between 180 and 210 nm and between 210 and 350 nm. In such a case, absorbency was compared with respect to these peaks as a whole.

Figure 1A:
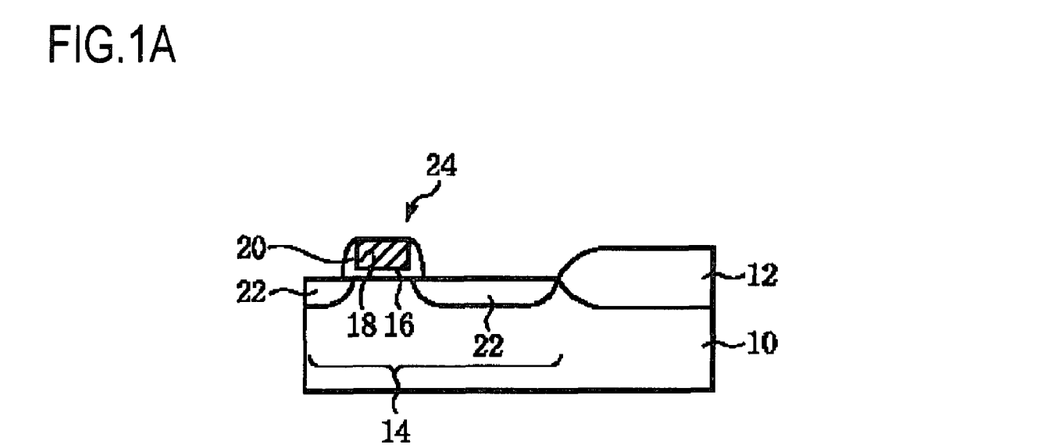
FIG. 1A, FIG. 1B and FIG. 1C are diagrams showing a semiconductor device manufacturing process.
Figure 1B:
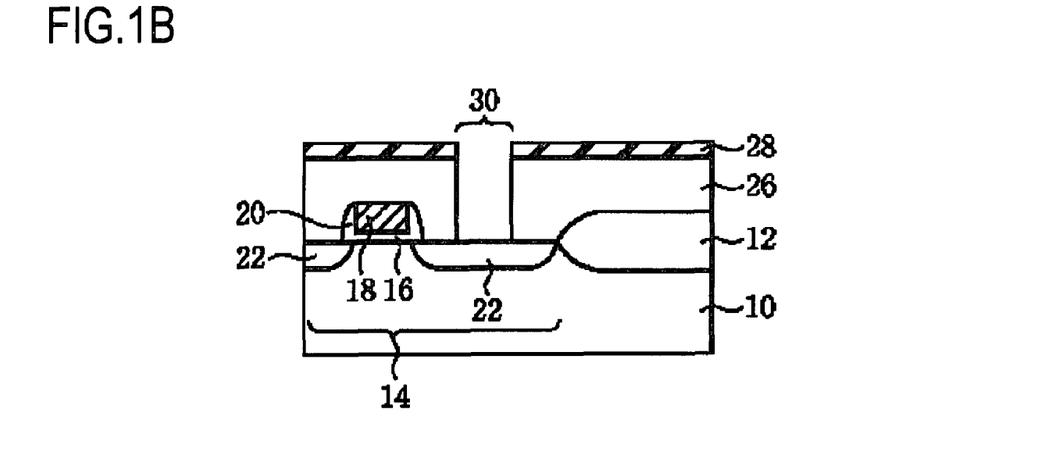
Figure 1C:
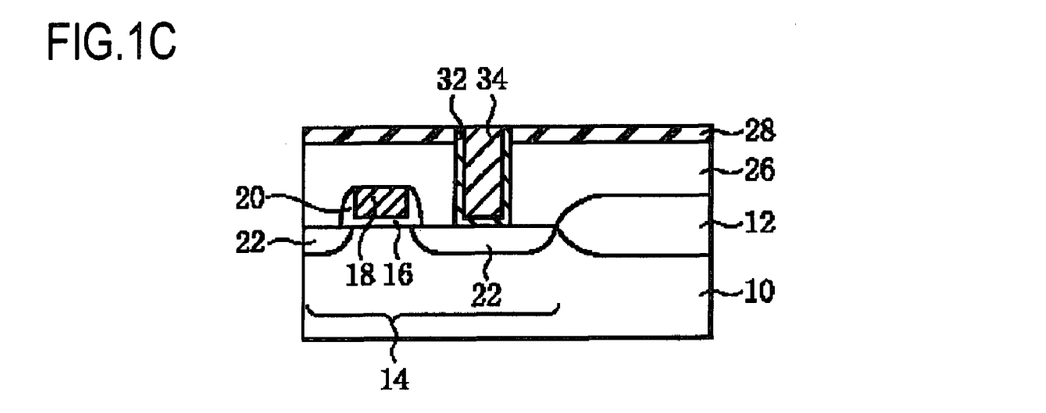

(2) First, as shown in FIG. 1A, FIG. 1B and FIG. 1C, element separator film 12 was formed by LOCOS (Local Oxidation of Silicon) on semiconductor substrate 10. Element region 14 was defined by element separator film 12. A silicon substrate was used for semiconductor substrate 10.

(3) Next, gate electrode 18 was formed on element region 14 with gate insulating film 16 in between. Side-wall insulating film 20 was then formed on the sides of gate electrode 18. Next, dopant impurities were introduced into semiconductor substrate 10 using side-wall insulating film 20 and gate electrode 18 as masks to thereby form source/drain diffusion layers 22 in semiconductor substrate 10 on both sides of gate electrode 18. In this way, transistor 24 was formed having gate electrode 18 and source/drain diffusion layers 22 (see FIG. 1A).

(4) Next, interlayer insulating film 26 consisting of a silicon oxide film was formed on the entire surface by CVD using tetraethoxysilane (TEOS).

(5) Next, 50 nm-thick stopper film 28 was formed on interlayer insulating film 26. An SiN film formed by plasma CVD was used as the material of stopper film 28. Stopper film 28 functioned as a stopper when polishing tungsten film 34 and the like by CMP in the process described below. Stopper film 28 also functioned as an etching stopper when forming trench 46 on interlayer insulating film 38 and the like in the process described below.

(6) Next, contact hole 30 was formed by photolithography as far as source/drain diffusion layer 22 (see FIG. 1B).

(7) Next, 50 nm-thick adhesion layer 32 was formed of TiN film by sputtering on the entire surface. Adhesion layer 32 ensures adhesion of the conductive plug described below with the underlayer.

(8) Next, tungsten film 34 was formed with a thickness of 1 μm by CVD on the entire surface.

(9) Next, adhesion layer 32 and tungsten film 34 were polished by CMP to expose the surface of stopper film 28. In this way, conductive plug 34 consisting of tungsten was embedded in the contact hole (FIG. 1C).

Figure 2A:
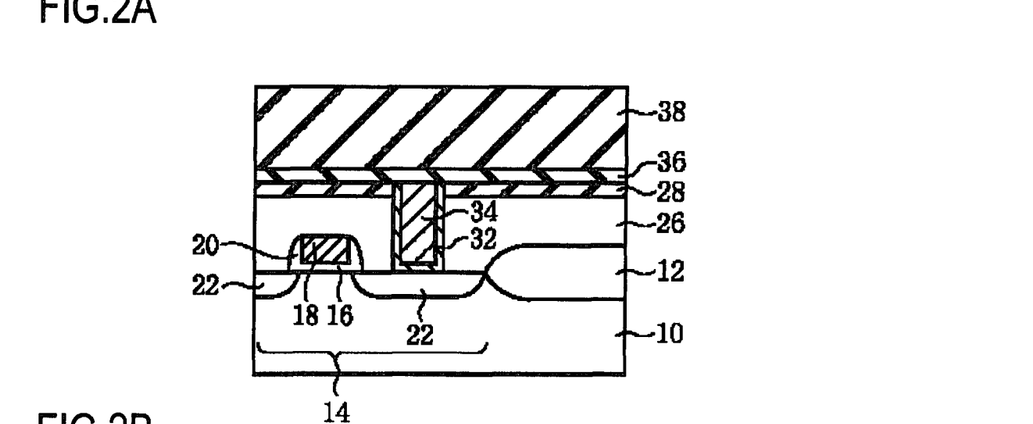
FIG. 2A, FIG. 2B and FIG. 2C are diagrams showing a semiconductor device manufacturing process.

(10) Next, as shown in FIG. 2A, 30 nm-thick interlayer insulating film 36 (SiC:O:H film (film containing O and H in addition to SiC)) was formed by CVD.

(11) Next, porous interlayer insulating film 38 was formed on the entire surface as shown in FIG. 2A. An interlayer insulating film consisting of porous silica (porous silica film) was formed as porous interlayer insulating film 38. The film thickness of porous interlayer insulating film 38 was 160 nm.

Figure 2B:
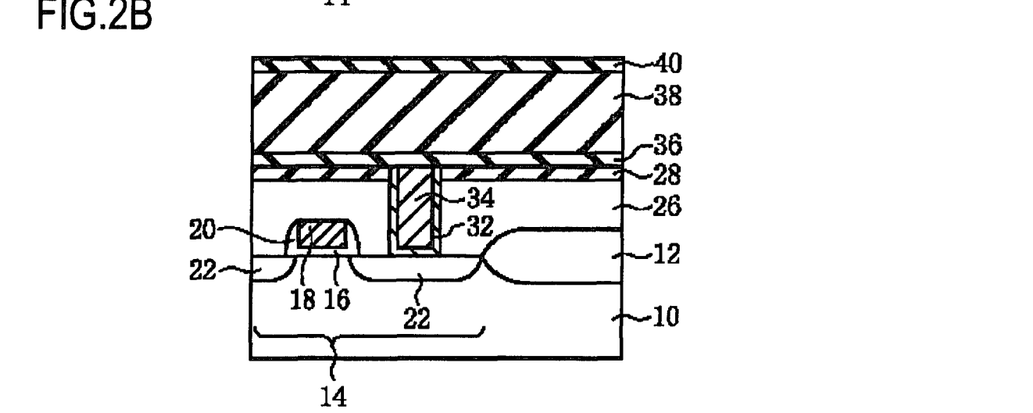

(12) Next, as shown in FIG. 2B, a silicon compound provided with substituents under the conditions shown in Table 1 (substituted silicon compound) was coated on the entire surface of semiconductor substrate 10 with porous interlayer insulating film 38 formed thereon to thereby form interlayer insulating film 40. The film thickness was 30 nm.

(13) This was then exposed to UV from above interlayer insulating film 40 to thereby cure the porous interlayer insulting film.

Figure 2C:
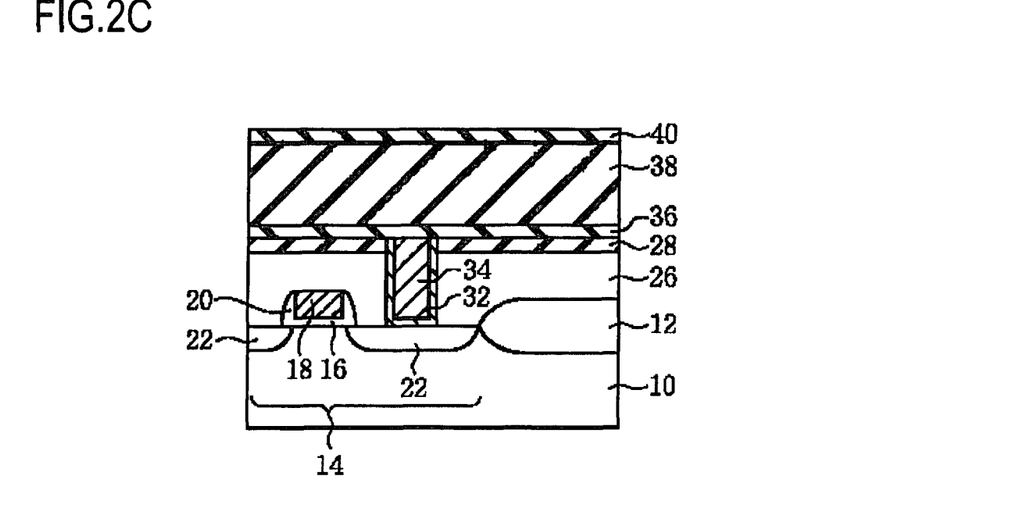

(14) Next, photoresist film 42 was formed by spin coating on the entire surface.

(15) Opening 44 was then formed by photolithography in photoresist film 42. Opening 44 was for forming first layer wiring (first metal wiring layer) 50. Opening 44 was formed in photoresist layer 42 so as to obtain a wiring width of 100 nm and a wire spacing of 100 nm.

(16) Next, insulating film 40, interlayer insulating film 38 and insulating film 36 were etched using photoresist film 42 as a mask. Etching was performed with fluorine plasma using $CF_4$ gas and $CHF_3$ gas as the raw materials. Stopper film 28 functioned as an etching stopper in this process. In this way, trench 46 for embedding wiring was formed in insulating film 40, interlayer insulating film 38 and insulating film 36 (see FIG. 3A). The top surface of conductive plug 34 was exposed in trench 46. Photoresist film 42 was then peeled off.

Figure 3A:
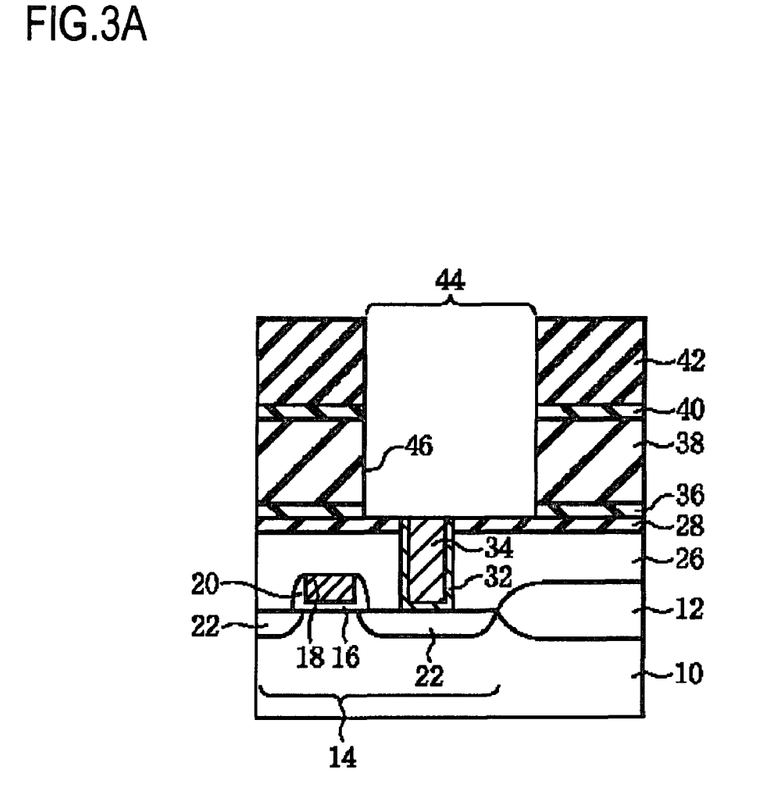
FIG. 3A and FIG. 3B are diagrams showing a semiconductor device manufacturing process.

(17) A barrier film (not shown) consisting of TaN was then formed with a thickness of 10 nm by sputtering on the entire surface. The purpose of the barrier film is to prevent Cu in the wiring as described below from diffusing into the insulating films. Next, a seed film (not shown) of Cu was formed with a thickness of 10 nm by sputtering on the entire surface. The seed film functioned as an electrode when forming Cu wiring by electroplating. In this way, layered film 48 was formed consisting of a barrier film and a seed film.

(18) Next, 600 nm-thick Cu film 50 was formed by electroplating.

(19) Next, Cu film 50 and layered film 48 were polished by CMP to expose the surface of the insulating film. Wiring 50 consisting of Cu was thereby embedded in the trench. This process of producing wiring 50 is called single damascene.

Figure 3B:
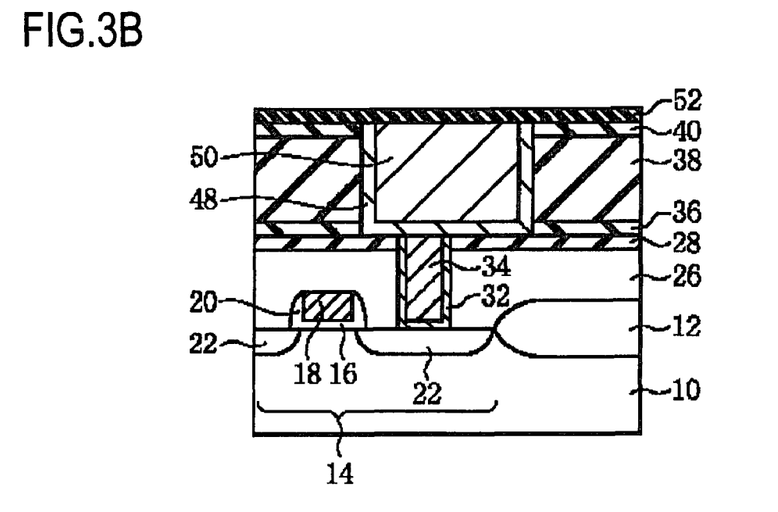

(20) Next, interlayer insulating film 52 (SiC:O:H film) was formed by CVD to a thickness of 30 nm as shown in FIG. 3B.

Figure 4A:
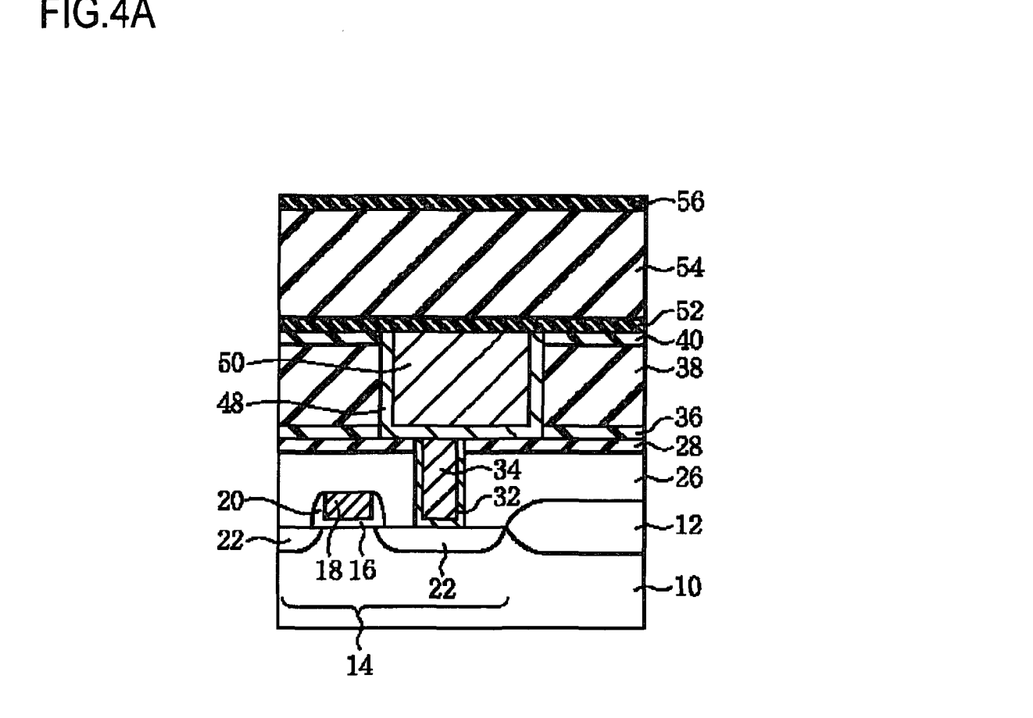
FIG. 4A and FIG. 4B are diagrams showing a semiconductor device manufacturing process.

(21) Next, as shown in FIG. 4A, porous interlayer insulating film 54 was formed on the entire surface. The method used to form porous interlayer insulating film 54 was similar to the method used to form porous interlayer insulating film 38 above. The film thickness of porous interlayer insulating film 54 was 180 nm.

Figure 4B:
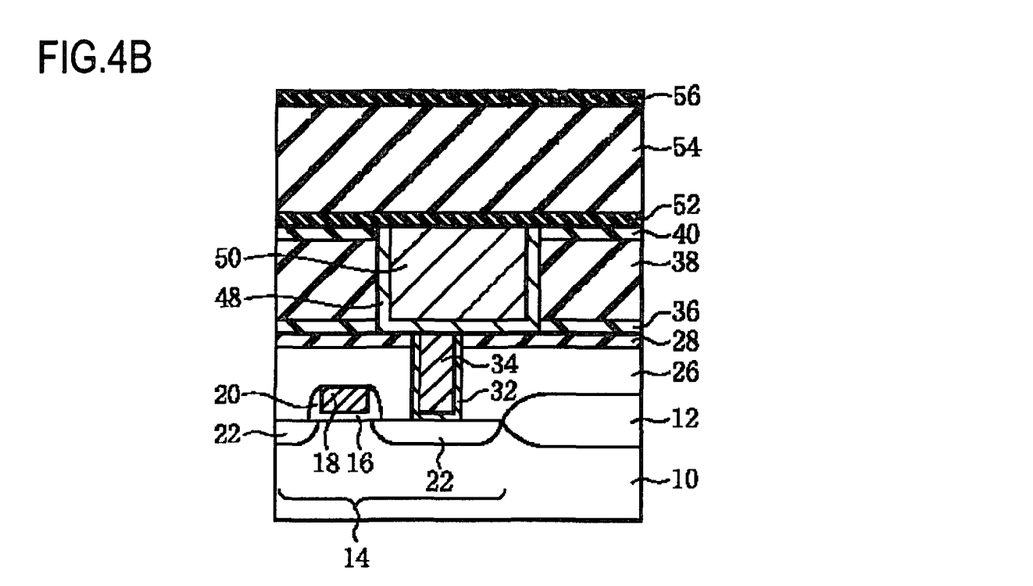

(22) Next, as shown in FIG. 4B, a silicon compound provided with substituents under the conditions shown in Table 1 was coated on the entire surface of semiconductor substrate 10 having porous interlayer insulating film 54 formed thereon to thereby form interlayer insulating film 56. The method used to form interlayer insulating film 56 was similar to the method used to form interlayer insulating film 40 above. The film thickness was 30 nm.

(23) This was then exposed to UV from above interlayer insulating film 56 to thereby cure the porous interlayer insulating film.

Figure 5A:
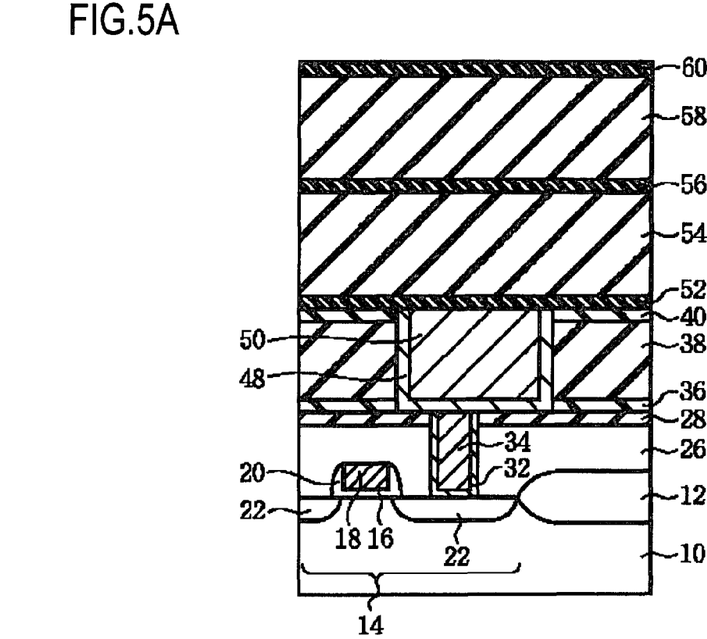
FIG. 5A and FIG. 5B are diagrams showing a semiconductor device manufacturing process.

(24) Next, porous interlayer insulating film 58 was formed as shown in FIG. 5A. The method used to form porous interlayer insulating film 58 was similar to the method used to form porous interlayer insulating film 38 above. The film thickness of porous interlayer insulating film 58 was 160 nm.

Figure 5B:
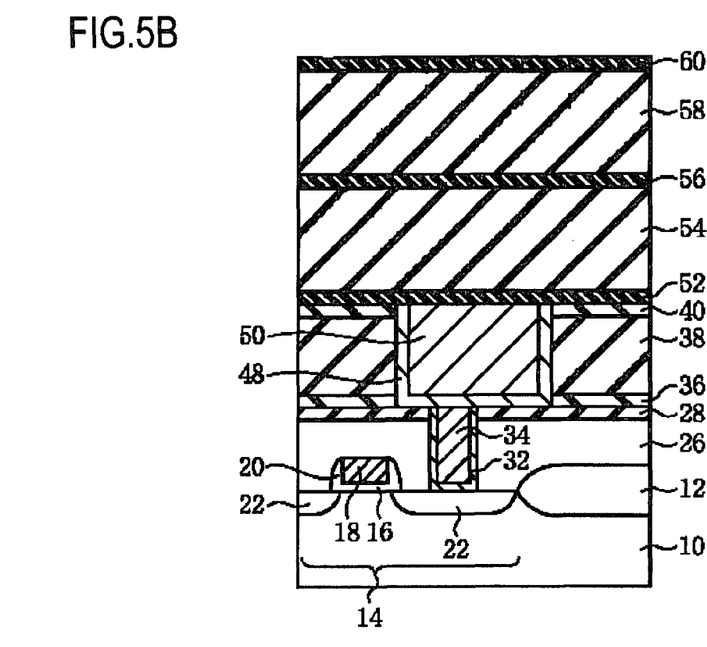

(25) Next, as shown in FIG. 5B, a silicon compound provided with substituents under the conditions shown in Table 1 was coated on the entire surface of semiconductor substrate 10 having porous interlayer insulating film 58 formed thereon to thereby form interlayer insulating film 60. The method used to form interlayer insulating film 60 was similar to the method used to form interlayer insulating film 40 above. The film thickness was 30 nm.

(26) This was then exposed to UV from above interlayer insulating film 60 to thereby cure the porous interlayer insulating film.

(27) Next, photoresist film 62 was formed by spin coating on the entire surface.

Figure 6:
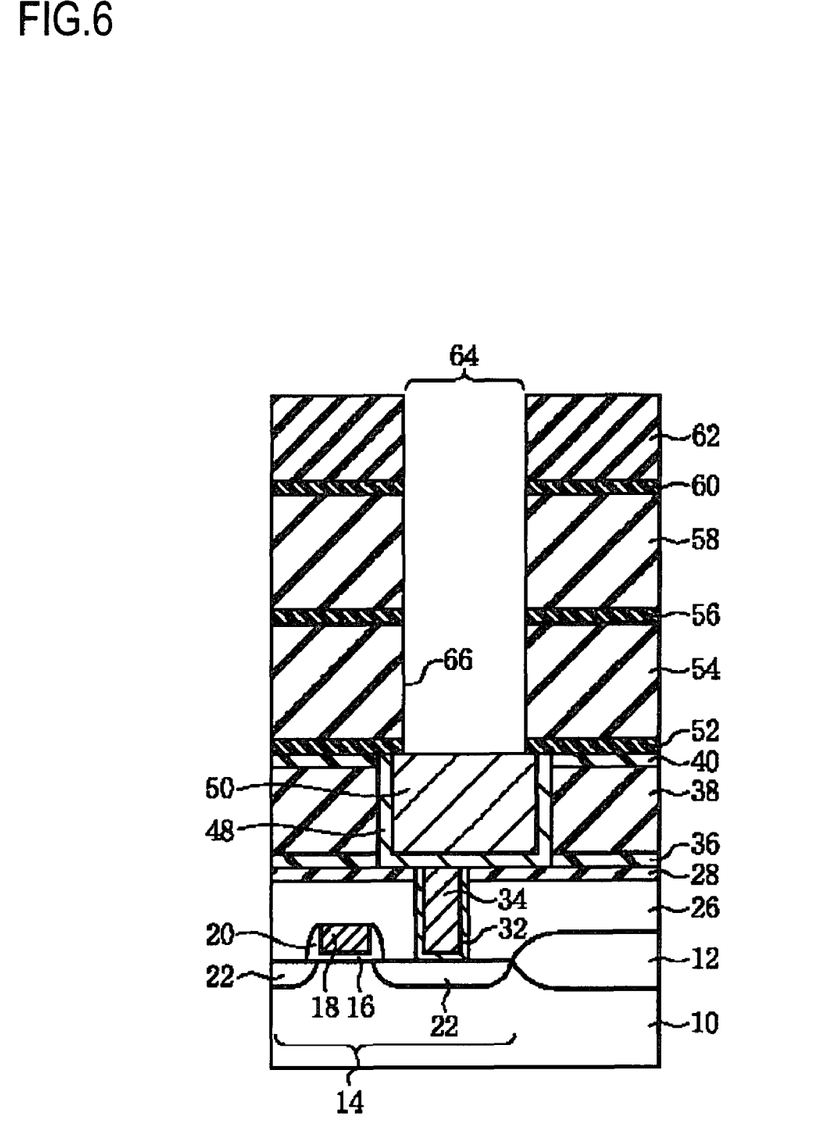
FIG. 6 is a diagram showing a semiconductor device manufacturing process.

(28) Next, as shown in FIG. 6, opening 64 was formed by photolithography in photoresist film 62. The purpose of opening 64 was to form contact hole 64 extending to wiring 50.

(29) Next, insulating film 60, interlayer insulating film 58, insulating film 56, interlayer insulating film 54 and insulating film 52 were etched using photoresist film 62 as the mask. Etching was performed with fluorine plasma using $CF_4$ gas and $CHF_3$ gas as the raw materials. Insulating film 60, interlayer insulating film 58, insulating film 56, interlayer insulating film 54 and insulating film 52 can be etched by appropriately changing the compositional ratios of the etching gases and the pressure and the like during etching. Contact hole 66 was thus formed extending to wiring 50. Photoresist film 62 was then peeled off.

(30) Next, photoresist film 68 was formed by spin coating on the entire surface.

Figure 7:
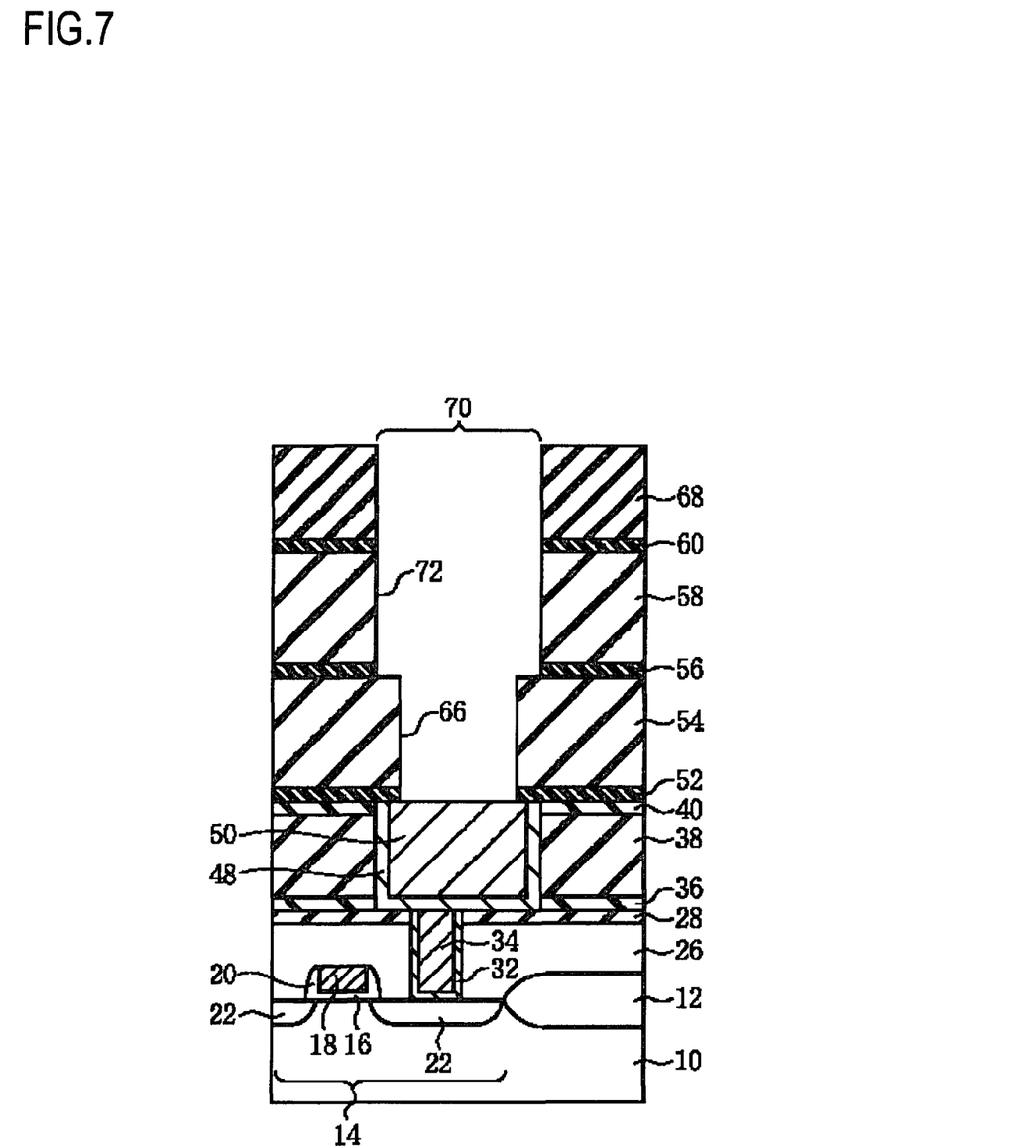
FIG. 7 is a diagram showing a semiconductor device manufacturing process.

(31) Next, as shown in FIG. 7, opening 70 was formed by photolithography in photoresist film 68. The purpose of this opening 70 was to form second-layer wiring (second metal wiring layer) 76a.

(32) Insulating film 60, interlayer insulating film 58 and insulating film 56 were then etched using photoresist film 68 as the mask. Etching was performed with fluorine plasma using $CF_4$ gas and $CHF_3$ gas as the raw materials. In this way, trench 72 for embedding wiring 76a was formed in insulating film 60, interlayer insulating film 58 and insulating film 56. Trench 72 was connected to contact hole 66.

(33) Next, a barrier film (not shown) consisting of TaN with a film thickness of 10 nm was formed by sputtering on the entire surface. The purpose of this barrier film was to prevent diffusion of the Cu in wiring 76a and conductive plug 76b (discussed below). Next, a seed film (not shown) consisting of Cu with a film thickness of 10 nm was formed by sputtering on the entire surface. The seed film functioned as an electrode when forming wiring 76a and conductive plug 76b of Cu by electroplating. In this way, layered film 74 was formed consisting of a barrier film and a seed film.

(34) Next, 1400 nm-thick Cu film 76 was formed by electroplating.

(35) Next, Cu film 76 and layered film 74 were polished by CMP to expose the surface of insulating film 60. In this way, conductive plug 76b consisting of Cu was embedded in contact hole 66, while wiring 76a consisting of Cu was embedded in trench 72. Conductive plug 76b and wiring 76a were formed as a unit. The manufacturing process whereby conductive plug 76b and wiring 76a are formed at once is called "dual damascene".

Figure 8:
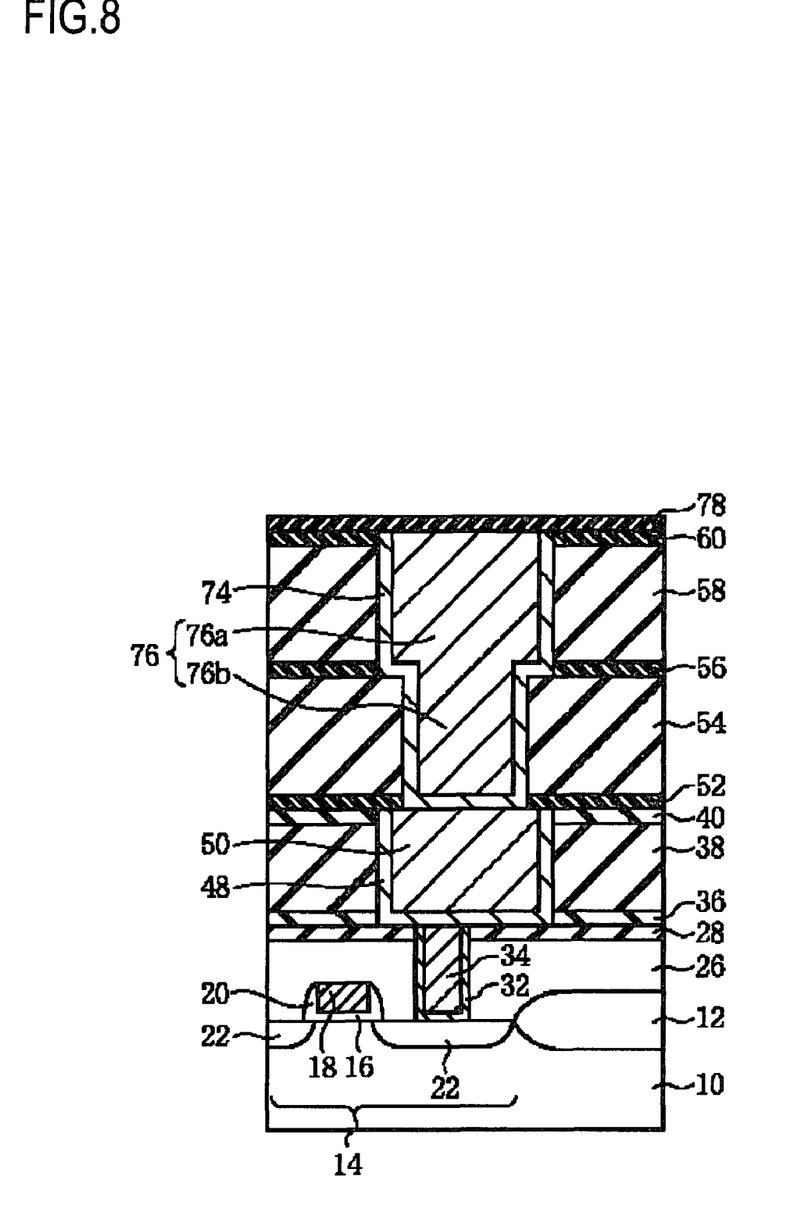
FIG. 8 is a diagram showing a semiconductor device manufacturing process.

(36) Next, interlayer insulating film 78 with a thickness of 30 nm was formed by CVD as shown in FIG. 8.

(37) Subsequently, the third layer of wiring (third metal wiring layer, not shown) was formed by repeating steps similar to those described above.

(38) Semiconductor devices were formed in this way using the substituted silicon compounds of Table 1 (which pertain to Examples 1 to 6), wires and conductive plugs were formed of the resulting semiconductor devices so as to electrically connect 1 million conductive plugs in series, and these were evaluated by measuring yield and the like. The results are shown in Tables 1 and 2. Yields were 89.5 to 93.1%.

(39) Effective relative permittivities between wires were calculated as 2.6 to 2.7. Effective relative permittivity means relative permittivity as measured with the wiring surrounded not only by the porous interlayer insulating films but also by the other insulating films. Despite the low relative permittivity of the porous interlayer insulating films, because the wiring is also surrounded by insulating layers with relatively high permittivity, the effective relative permittivity value is higher than the relative permittivity of the porous interlayer insulating films.

(40) When the resistances of the wirings were measured after they had been left for 3000 hours at 200° C., no rise in resistance was observed.

(41) When the C concentrations of the porous insulating films after UV exposure were measured by X-ray photoelectron spectroscopy (XPS), there was found to be no decrease in C concentrations, which were 11 to 12 atom % or equivalent to those before UV exposure in all cases.

(42) Table 1 shows film strength data. It can be seen from Table 1 that good film strength was obtained despite the low relative permittivity. By contrast, film strength is greatly diminished when attempting to obtain such low permittivity with prior art.

Comparative Examples 1, 2

These were produced as in Examples 1 to 6 except that the unsubstituted silicon compounds shown in Table 1 were used instead of the substituted silicon compound.

Semiconductor devices were thus formed using the unsubstituted silicon compounds shown in Table 1 for Comparative Examples 1 and 2, and when wires and conductive plugs were formed so as to electrically connect 1 million conductive plugs in series, the measured yields were 59.2 to 63.2%, while the calculated effective relative permittivities between wires were 3.1 to 3.2. When the resistances of the wirings were measured after they had been left for 3000 hours at 200° C., a rise in resistance was confirmed. It appears that better results were obtained in Example 1 in all cases because the substituted silicon compounds had the effect of cutting off ultraviolet of 210 nm or less. That is, by cutting off ultraviolet of 210 nm or less it was possible to control moisture absorption due to cleavage of Si—C bonds in the porous insulating films.

When the C concentrations of the porous insulating film were measured by XPS, a decrease was confirmed in the C concentrations, which fell to 6 to 7 atom %. By contrast, it is believed that the reason that no decrease in C concentration was observed in Example 1 is that there was effectively no loss of methyl groups and the like due to cleavage of Si—C bonds.

TABLE 1

| | Substituted silicon compound | | Porous insulating film C concentration (atom %) | Effective permittivity | Yield (%) | Porous insulating film strength (GPa) |
| --- | --- | --- | --- | --- | --- | --- |
| | Unsubstituted silicon compound | Substituent | | | | |
| Ex 1 | Formula 1 | Benzyl | 12 | 2.6 | 92.1 | 15 |
| 2 | | Carbonyl | 11 | 2.6 | 90.8 | 15 |
| 3 | | Carboxy | 12 | 2.6 | 89.5 | 15 |
| 4 | Formula 2 | Benzyl | 11 | 2.7 | 93.1 | 15 |
| 5 | | Carbonyl | 11 | 2.6 | 89.5 | 14 |
| 6 | | Carboxy | 12 | 2.6 | 90.8 | 14 |
| CE1 | Formula 1 (as is) | | 7 | 3.1 | 59.2 | 15 |
| CE2 | Formula 2 (as is) | | 6 | 3.2 | 63.2 | 14 |

TABLE 2

| | Substituted silicon compound | | (UV absorbency 1)/ (UV absorbency 2) | UV absorbency (%) at 210 nm or less |
|---|---|---|---|---|
| | Unsubstituted silicon compound | Substituent | | |
| Ex1 | Formula 1 | Benzyl | 4.6 | 88 |
| 2 | | Carbonyl | 3.2 | 76 |
| 3 | | Carboxy | 3.4 | 83 |
| 4 | Formula 2 | Benzyl | 3.7 | 75 |
| 5 | | Carbonyl | 2.8 | 69 |
| 6 | | Carboxy | 3.1 | 72 |
| CE1 | Formula 1 (as is) | | 2.3 | 56 |
| CE2 | Formula 2 (as is) | | 1.9 | 53 |

In Table 1, $R^1$ and $R^2$ in the unsubstituted silicon compound (polycarbosilane) were H, and n was 213. $R^1$ through $R^3$ in the unsubstituted silicon compound (polysilazane) were H, and n was 264.

Relative to the number of hydrogen atoms in $R^1$ and $R^2$ or $R^1$ through $R^3$, the percentage of benzyl groups was 27% in Examples 1 and 4, the percentage of carbonyl groups was 15% in Examples 2 and 5 and the percentage of carboxy groups was 21% in Examples 3 and 6.

Example 7

Films of the silicon compounds of the present embodiments or films for comparative purposes were formed on quartz substrates, and the UV absorption spectra at 180 to 350 nm were measured with a vacuum ultraviolet spectrometer (SGV-157, Shimadzu) to thereby confirm that in the films of the silicon compounds of the present embodiments, the ratios of UV absorbency 1 of the silicon compound at the UV peak between 180 and 210 nm to UV absorbency 2 of the same silicon compound at the UV peak between 210 and 350 nm (UV absorbency 1)/(UV absorbency 2) were not less than 2.5. The results are shown in Table 2. UV absorbencies at 210 nm or less were also measured in the same way.

Example 8

A polycarbosilane having benzyl groups and higher UV absorbency at 210 nm or less than the unsubstituted polycarbosilane can be prepared by halogenating $R^1$ or $R^2$ in the polycarbosilane represented by Formula 1 below in which $R^1$ and $R^2$ are both H, and then reacting the compound with a Grignard reagent containing a benzyl group.

What is claimed is:

1. A method for manufacturing a multilayer wiring device, comprising:
   providing a silicon compound having a structure in which at least part of $R^1$ through $R^3$ in a silicon compound consisting of a polycarbosilane represented by Formula 1 below, a polysilazane represented by Formula 2 below or a mixture thereof is substituted with another group, and having higher UV absorbency at 210 nm or less than a silicon compound without the substitution:

[C7]

(1)

[C8]

$$-\left(\underset{R^2}{\overset{R^1}{\underset{|}{\overset{|}{Si}}}}-\underset{R^3}{\overset{}{\underset{|}{N}}}\right)_n \quad (2)$$

(wherein in Formula 1, $R^1$ and $R^2$ may be the same or different and each represents a hydrogen atom or optionally substituted alkyl group, alkenyl group, cycloalkyl group or aryl group, and n is a number from 10 to 1000; and in Formula 2, $R^1$, $R^2$ and $R^3$ may be the same or different and each represents a hydrogen atom or optionally substituted alkyl group, alkenyl group, cycloalkyl group or aryl group, but at least one of substituents $R^1$, $R^2$ and $R^3$ is a hydrogen atom, and n is the number of repeating units necessary to give the silazane polymer a number-average molecular weight of 100 to 50,000; and the symbols in Formula 1 and Formula 2 are independent of each other);
   forming a porous insulating film precursor layer on or over a substrate;
   forming a layer of said silicon compound directly on the porous insulating film precursor; and
   curing the porous insulating film precursor to form a cured porous film by irradiating UV through the silicon compound layer.

2. The method for manufacturing a multilayer wiring device according to claim 1, wherein the porous insulating film precursor layer is formed using a coatable silica cluster precursor.

3. The method for manufacturing a multilayer wiring device according to claim 2, wherein the coatable silica cluster precursor is formed by hydrolysis with a quaternary alkylamine.

4. The method for manufacturing a multilayer wiring device according to claim 1, wherein the UV light source has a wavelength range of 200 to 800 nm.

5. The method for manufacturing a multilayer wiring device according to claim 4, wherein the UV light source having a wavelength range of 200 to 800 nm is a high-pressure mercury lamp, ozoneless high-pressure mercury lamp, metal halide lamp, xenon lamp or deuterium lamp.

6. The method for manufacturing a multilayer wiring device according to claim 1, wherein the ultraviolet exposure is performed with a 254 nm UV intensity of 1 mW/cm² or more at a wafer surface as measured with a spectroradiometer.

7. The method for manufacturing a multilayer wiring device according to claim 1, wherein the ultraviolet exposure is performed with heating at a temperature of 50 to 470° C.

8. The method for manufacturing a multilayer wiring device according to claim 1, wherein the ratio of UV absorbency 1 of the silicon compound at the UV peak between 180 and 210 nm and UV absorbency 2 of the silicon compound at the UV peak between 210 and 350 nm (UV absorbency 1/UV absorbency 2) is greater than or equal to 2.5.

9. The method for manufacturing a multilayer wiring device according to claim 1, wherein the other group is selected from the group consisting of a benzyl group, carbonyl group, carboxy group, acryloyl group, diazo group, azide group, cinnamoyl group, acrylate group, cinnamylidene group, cyanocinnamylidene group, furylpentadiene group and p-phenylenediacrylate group.

10. A method for manufacturing a semiconductor device, comprising:

providing a silicon compound having a structure in which at least part of $R^1$ through $R^3$ in a silicon compound consisting of a polycarbosilane represented by Formula 1 below, a polysilazane represented by Formula 2 below or a mixture thereof is substituted with another group, and having higher UV absorbency at 210 nm or less than a silicon compound without the substitution:

[C7]

(1)

[C8]

(2)

(wherein in Formula 1, $R^1$ and $R^2$ may be the same or different and each represents a hydrogen atom or optionally substituted alkyl group, alkenyl group, cycloalkyl group or aryl group, and n is a number from 10 to 1000; and in Formula 2, $R^1$, $R^2$ and $R^3$ may be the same or different and each represents a hydrogen atom or optionally substituted alkyl group, alkenyl group, cycloalkyl group or aryl group, but at least one of substituents $R^1$, $R^2$ and $R^3$ is a hydrogen atom, and n is the number of repeating units necessary to give the silazane polymer a number-average molecular weight of 100 to 50,000; and the symbols in Formula 1 and Formula 2 are independent of each other);

forming a porous insulating film precursor layer on or over a substrate:

forming a layer of said silicon compound directly on the porous insulating film precursor; and curing the porous insulating film precursor to form a cured porous film by irradiating UV through the silicon compound layer.

11. The method for manufacturing a semiconductor device according to claim 10, wherein the porous insulating film precursor layer is formed using a coatable silica cluster precursor.

12. The method for manufacturing a semiconductor device according to claim 11, wherein the coatable silica cluster precursor is formed by hydrolysis with a quaternary alkylamine.

13. The method for manufacturing a semiconductor device according to claim 10, wherein the UV light source has a wavelength range of 200 to 800 nm.

14. The method for manufacturing a semiconductor device according to claim 13, wherein the UV light source having a wavelength range of 200 to 800 nm is a high-pressure mercury lamp, ozoneless high-pressure mercury lamp, metal halide lamp, xenon lamp or deuterium lamp.

15. The method for manufacturing a semiconductor device according to claim 10, wherein the ultraviolet exposure is performed with a 254 nm UV intensity of 1 mW/cm$^2$ or more at a wafer surface as measured with a spectroradiometer.

16. The method for manufacturing a semiconductor device according to claim 10, wherein the ultraviolet exposure is performed with heating at a temperature of 50 to 470° C.

17. The method for manufacturing a semiconductor device according to claim 10, wherein the ratio of UV absorbency 1 of the silicon compound at the UV peak between 180 and 210 nm and UV absorbency 2 of the silicon compound at the UV peak between 210 and 350 nm (UV absorbency 1/UV absorbency 2) is greater than or equal to 2.5.

18. The method for manufacturing a semiconductor device according to claim 10, wherein the other group is selected from the group consisting of a benzyl group, carbonyl group, carboxy group, acryloyl group, diazo group, azide group, cinnamoyl group, acrylate group, cinnamylidene group, cyanocinnamylidene group, furylpentadiene group and p-phenylenediacrylate group.

* * * * *